US008961729B2

United States Patent
Zhao et al.

(10) Patent No.: US 8,961,729 B2
(45) Date of Patent: Feb. 24, 2015

(54) METHOD FOR MANUFACTURING TOUCH PANEL

(71) Applicant: Shanghai Tianma Micro-Electronics Co., Ltd., Shanghai (CN)

(72) Inventors: Lijun Zhao, Shanghai (CN); Jun Ma, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 14/086,684

(22) Filed: Nov. 21, 2013

(65) Prior Publication Data

US 2014/0076489 A1    Mar. 20, 2014

Related U.S. Application Data

(63) Continuation of application No. PCT/CN2012/084256, filed on Nov. 7, 2012.

(30) Foreign Application Priority Data

Aug. 17, 2012  (CN) .......................... 2012 1 0295389

(51) Int. Cl.
| | |
|---|---|
| *B29C 65/00* | (2006.01) |
| *B32B 37/00* | (2006.01) |
| *B32B 38/10* | (2006.01) |
| *B05D 5/12* | (2006.01) |
| *H05K 3/00* | (2006.01) |
| *C08J 7/18* | (2006.01) |
| *H05K 3/02* | (2006.01) |
| *G06F 3/041* | (2006.01) |

(52) U.S. Cl.
CPC ............... *H05K 3/027* (2013.01); *G06F 3/041* (2013.01); *G06F 2203/04103* (2013.01); *H05K 3/0097* (2013.01); *H05K 2203/107* (2013.01)
USPC ........ 156/247; 156/248; 156/257; 156/272.2; 156/272.8; 156/701; 156/712; 427/96.1; 427/97.4; 427/555

(58) Field of Classification Search
USPC ........... 156/247, 248, 257, 272.2, 272.8, 701, 156/712; 438/585; 414/219
See application file for complete search history.

(56) References Cited

U.S. PATENT DOCUMENTS

| | | | | |
|---|---|---|---|---|
| 4,689,103 | A * | 8/1987 | Elarde | 156/242 |
| 5,830,776 | A * | 11/1998 | Kurogane et al. | 438/30 |
| 6,236,391 | B1 * | 5/2001 | Kent et al. | 345/177 |
| 6,325,902 | B1 * | 12/2001 | Shishido et al. | 204/192.29 |
| 6,806,496 | B2 * | 10/2004 | Inoue | 257/59 |
| 7,554,624 | B2 * | 6/2009 | Kusuda et al. | 349/58 |
| 7,674,712 | B2 * | 3/2010 | Cok | 438/675 |
| 8,279,201 | B2 * | 10/2012 | Kang et al. | 345/176 |
| 2010/0316870 | A1 * | 12/2010 | Okabe et al. | 428/337 |
| 2014/0033971 | A1 * | 2/2014 | Kramer et al. | 118/301 |

FOREIGN PATENT DOCUMENTS

| | | |
|---|---|---|
| CN | 101396770 A | 4/2009 |
| CN | 101950225 A | 1/2011 |

* cited by examiner

*Primary Examiner* — Sing P Chan
(74) *Attorney, Agent, or Firm* — Kilpatrick Townsend & Stockton LLP

(57) ABSTRACT

A method of manufacturing a touch panel is disclosed. The method includes providing a plurality of substrates, each having a size, providing a carrier including a plurality of grooves each having a size corresponding with the size of the substrates. The method also includes placing the plurality of substrates into the grooves, simultaneously forming a touch structure layer on each of the substrates, and separating substrates from the carrier.

20 Claims, 3 Drawing Sheets

METHOD FOR MANUFACTURING TOUCH PANEL

CROSS-REFERENCES TO RELATED APPLICATIONS

This application claims priority to and is a continuation of PCT/CN2012/084256, filed on Nov. 7, 2012 and entitled "METHOD FOR MANUFACTURING TOUCH PANEL", which application claims the benefit of Chinese Patent Application No. 201210295389.8, filed with the Chinese Patent Office on Aug. 17, 2012, and entitled "METHOD FOR MANUFACTURING TOUCH PANEL", the contents of which are incorporated herein by reference in their entirety.

FIELD OF THE INVENTION

The present invention relates to the field of touch technology, and in particular to a method for manufacturing a touch panel.

BACKGROUND OF THE INVENTION

A touch panel, also known as a touch screen or a touch control panel, is widely used as a human-machine interactive input device in various electronic products such as a mobile phone, a Personal Digital Assistant (PDA), and a multimedia and public information inquiry system. It is possible for a user to touch the panel with a finger or a dedicated pen so that an electrical signal variation may be generated, to perform identification and selection operations on characters, symbols, menu, etc. displayed in the display device behind the touch panel, thereby realizing the input to the device.

The tempered glass has a smooth and glossy surface, and is provided with a high transmittance, creep resistance, fatigue resistance, friction resisting, good dimensional stability, abrasion resistance, high hardness, the most outstanding flexibility among thermoplastic plastics, and a good electrical insulation performance, and is less affected by temperature, and therefore is generally used for manufacturing a surface film of the touch panel of a mobile phone, for example.

In the prior art, the touch panel is manufactured generally by forming film on the tempered glass, and by exposing using mask and etching processes, etc. However, it is relatively expensive to use the mask; moreover, using the tempered glasses, it is necessary to assemble the small size tempered glasses into a carrier, and do the alignment of the mask and the carrier by positioning an alignment mark on the surface of the carrier to proceed with the exposing. Thus, mass production of the touch panels is difficult since the substrate is relatively smaller than the carrier and the exposure error is significant.

BRIEF SUMMARY OF THE INVENTION

One inventive aspect is a method of manufacturing a touch panel. The method includes providing a plurality of substrates, each having a size, providing a carrier including a plurality of grooves each having a size corresponding with the size of the substrates. The method also includes placing the plurality of substrates into the grooves, simultaneously forming a touch structure layer on each of the substrates, and separating substrates from the carrier.

DETAILED DESCRIPTION OF THE INVENTION

Embodiments are further illustrated with reference to the accompanying drawings, in order for better understanding of objects and features of the invention. However, the present invention may be implemented in various forms, and should not be construed to be limited to the embodiments.

Figure 1:
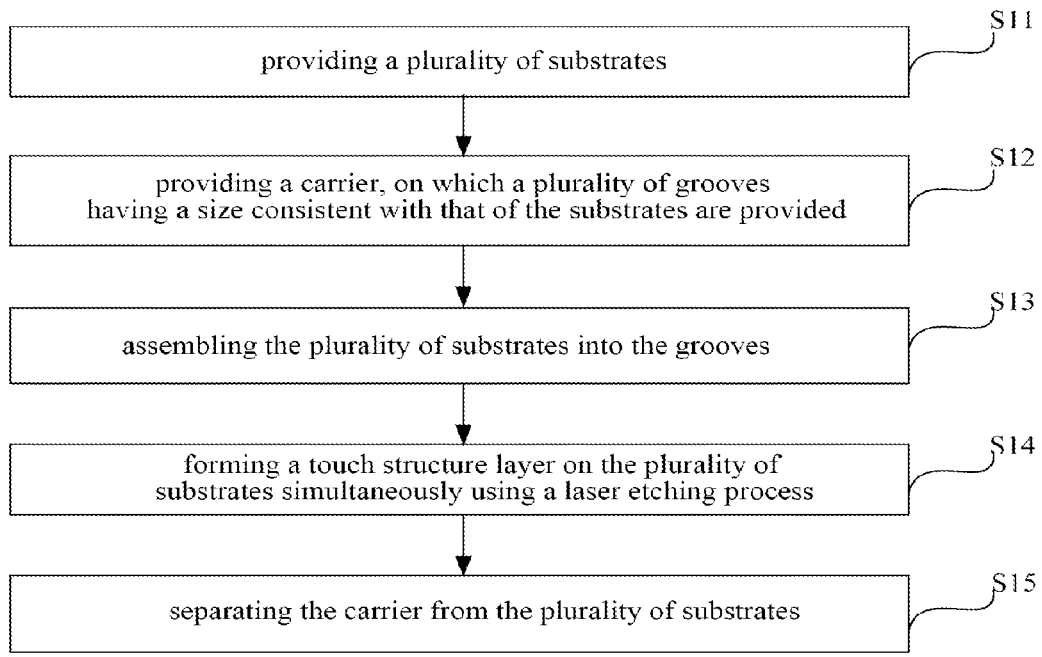
FIG. 1 is a flowchart showing a method for manufacturing a touch panel according to an embodiment of present invention.

As shown in FIG. 1, the present invention provides a method for manufacturing a touch panel, including the steps of:

S11: providing a plurality of substrates;

S12: providing a carrier which includes a plurality of grooves having a size consistent with the size of the substrates;

S13: assembling the plurality of substrates into the grooves;

S14: forming a touch structure layer on the plurality of substrates simultaneously by using a laser etching process; and S15: separating the carrier from the plurality of substrates.

Figure 2A:
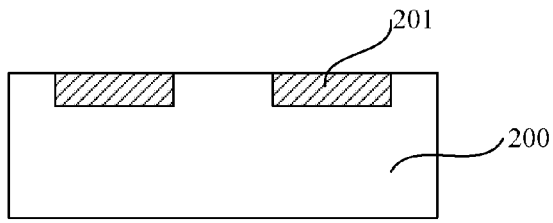
FIGS. 2A-2H are schematic diagrams showing the sectional structures of components during the process of manufacturing the touch panel according to the particular embodiment of the invention.

With reference to FIG. 2A, the plurality of substrates 201 provided at step S11 may be small-sized substrates used to produce touch panels of the mobile phone, PAD, etc., and may be made of tempered glass or quartz and have a thickness of a range from 0.3 mm to 3 mm. The tempered glass may be strengthened in a physical or chemical manner.

Further referring to FIG. 2A, a carrier 200 is provided in step S12, including a plurality of grooves, the size of the grooves is consistent and corresponds with the size of the substrates 201. In some embodiments, the size of the grooves is substantially identical to the size of the substrates. For example, the substrates may fit into the grooves with substantially no space between the substrate and grooves.

Further referring to FIG. 2A, in step S13, an adhesive is coated to the grooves or the assembly surfaces of the substrates 201, and then the substrates 201 are assembled into the grooves one to one; or the substrates 201 may be directly assembled into the grooves one to one without adhesive. Preferably, cleaning the surfaces of the carrier 200 and the substrates 201 after the assembling.

In step S14, the touch structure layer is formed simultaneously on the plurality of substrates 201 by the laser etching process. The touch structure layer may be a single-layer or a multi-layer, depending on manufacturing requirements of the touch panel, and the pattern of each layer, the stack and connection relationship between/among the touch structure layers may vary accordingly. In the present embodiment, the touch structure layer is formed through three steps of depositing and three steps of laser etching. It should be noted that, when the exposure method using mask is used to form the touch structure layer on the substrates 201 in the prior art, the mask and the carrier 200 are generally aligned by positioning an alignment mark, for example, on the entire surface of the carrier 200, and then the pattern of the mask is transferred to a film layer on the substrates 201 by the processes such as exposure and etching; here, since the substrates 201 are relatively small compared with the carrier 200, there would be an alignment error which causes an exposure error, resulting in a high cost and a low yield of the production. However, the laser etching process in step S14, which is different from the exposure process using mask in the prior art, has a higher precision, because a laser beam can be focused on each substrate 201 during the etching progress, that is, for example, the alignment mark on each substrate 201 can be positioned and the substrate 201 may be directly etched to form a pattern (i.e. the touch structure layer) with a higher precision, thereby reducing the exposure error in the prior art and resulting in a low cost and a high yield of the production.

Figure 2B:
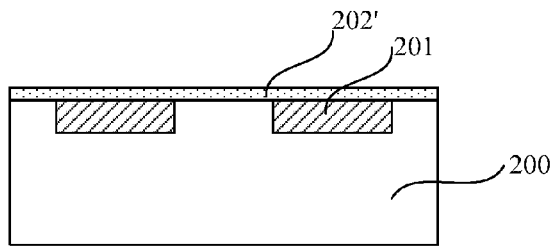
Figure 2C:
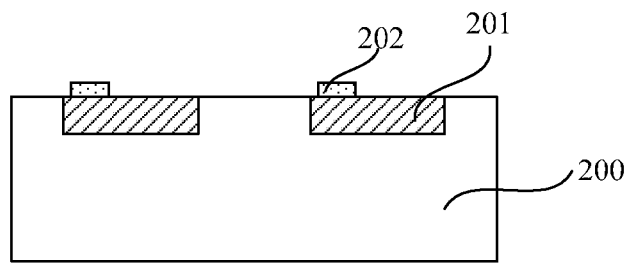

Referring to FIGS. 2B and 2C, in step S14, an Optical Clear Adhesive (OCA) (not shown) is coated on the surface of each substrate 201; then transparent electrode material 202' such as Indium Tin oxide, Indium Zinc oxide, carbon nanotube, and Aluminum-Titanium codoped Zinc oxide is deposited on the surfaces of all the substrates 201 and the carrier 200 by a sputter depositing method; and then the transparent electrode material 202' deposited on each of the substrates 201 is etched in sequence by the laser etching process to form a patterned first transparent electrode layer 202. In the present embodiment, the patterned first transparent electrode layer 202 is located at a side of the top surface of the substrate 201, and a laser device used in the laser etching process has an etching precision of 3~5 μm and operates with parameters: an operating area of 1300 mm×1300 mm, an operating speed of 0-48000 mm/min, an operating AC voltage of 380V±10%, and an operating frequency of 50 HZ. The patterned first transparent electrode layer 202 may be a driving layer of a mutual capacitive touch panel.

Figure 2D:
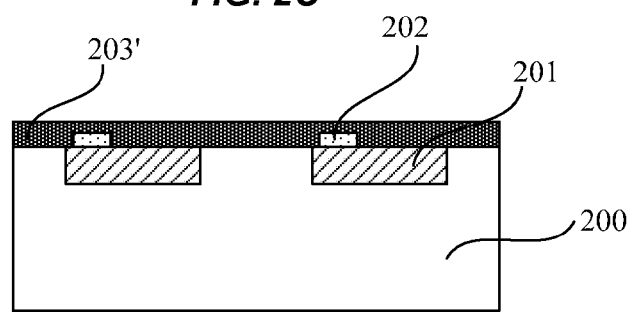
Figure 2E:
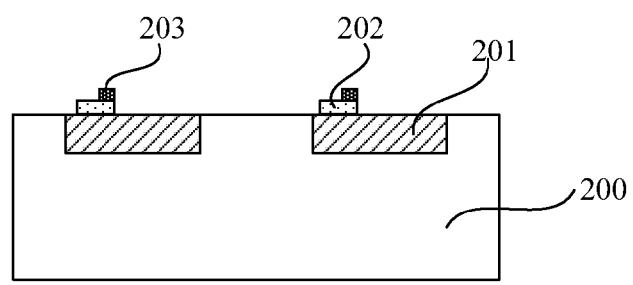

Referring to FIGS. 2D and 2E, in step S14, insulating material 203' such as silicon dioxide is deposited on the patterned first transparent electrode layers 202 and the uncovered part of surface of the substrates 201 by a chemical vapor deposition process, etc.; and then the insulating material deposited on each substrate 201 is etched by the laser etching process, so as to form the patterned insulating layer 203. In the present embodiment, the patterned insulating layer 203 is located on the patterned first transparent electrode layer 202 and exposes a part of the top of the patterned first transparent electrode layer 202, and a laser device used in the laser etching process has an etching precision of 3~5 μm and operates with parameters: an operating area of 1300 mm×1300 mm, an operating speed of 0-48000 mm/min, an operating AC voltage of 380V±10%, and an operating frequency of 50 HZ.

Figure 2F:
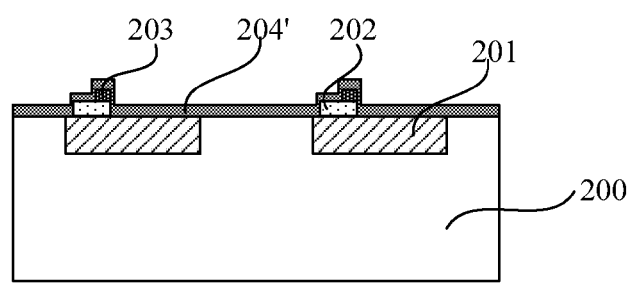
Figure 2G:
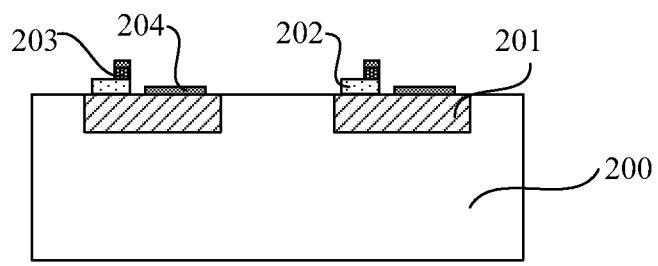

Referring to FIGS. 2F and 2G, in step S14, transparent electrode material such as Indium Tin oxide, Indium Zinc oxide, carbon nanotube, and Aluminum-Titanium codoped Zinc oxide is deposited on the patterned insulating layer 203 and the uncovered part of the surface of the device by the method such as sputter depositing; and then the transparent electrode material newly deposited on each substrate 201 is etched in sequence by the laser etching process to form a patterned second transparent electrode layer 204. In the present embodiment, the patterned second electrode layer 204 covers the patterned insulating layer 202 and exposes a part of the surface of each substrate 201, and a laser device used in the laser etching process has an etching precision of 3~5 μm and operates with parameters: an operating area of 1300 mm×1300 mm, an operating speed of 0-48000 mm/min, an operating AC voltage of 380V±10%, and an operating frequency of 50 HZ. The second transparent electrode layer 204 may be an inductive layer of a mutual capacitive touch panel.

In the present embodiment, after the touch layer structure is formed on the substrates, the junctions of the carrier 200 and the substrates 201 can be etched by the laser etching process or the conventional dry etching process or wet etching process, to separate the carrier 200 from the substrates 201, and separate two adjacent substrates 201 from each other, that is, to remove the covering layer that connects the carrier 200 with the substrates 201 at the junction of the carrier 200 and the substrates 201, here, the constituting layers of the covering layer may be the same as or different from those of the touch structure layer, depending on the preparing process of the touch structure layer. Alternatively, in forming various layers of the touch structure layer on the plurality of substrates 201, it is also possible to simultaneously etch the various layers formed between the carrier 200 and the substrates 201 and those between two adjacent substrates 201 by means of the laser etching process, so as to separate the carrier 200 from the substrates 201, and separate two adjacent substrates 201 from each other. Alternatively, it is also possible to cut the layer at the junctions of the carrier 200 and the substrates 201 by means of mechanical scribing, to separate the carrier 200 from the substrates 201, and separate two adjacent substrates 201 from each other.

Figure 2H:
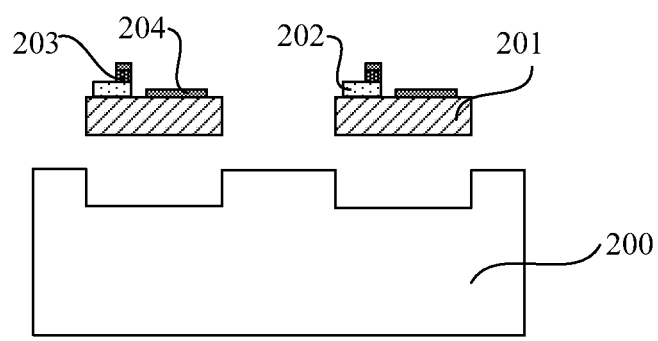

Referring to FIG. 2H, if an adhesive is used in step S13, then in step S15, it is possible to heat and melt the adhesive, and then remove the substrates 201 from the grooves of the carrier 200; and if no adhesive is used in step S13, then the substrates 201 can be removed directly from the grooves of the carrier 200 by applying mechanical force.

As can be seen, in the methods for manufacturing a touch panel discussed herein, a plurality of small-sized substrates are assembled into the carrier, then the film formed on the substrates is etched by the laser etching process to form the touch layer structure, and then the finished touch panel substrates are separated from the carrier, thereby reducing the error caused in the exposure process using mask and in the dry etching process or in the wet etching process, and facilitating and implementing the mass production of small-sized touch panels.

Those skilled in the art may make various alterations and variations to the invention without departing from the principle and scope of the present invention. Thus, the present invention is intended to include all these alterations and variations.

What is claimed is:

1. A method of manufacturing a touch panel, the method comprising:
   providing a plurality of substrates, each having a size;
   providing a carrier comprising a plurality of grooves, each having a size corresponding with the size of the substrates;
   placing the plurality of substrates into the grooves;
   simultaneously forming a touch structure layer on each of the substrates and on the carrier between the substrates;
   removing at least a portion of the touch structure layer from the carrier between the substrates; and
   separating substrates from the carrier.

2. The method of manufacturing the touch panel according to claim 1, wherein forming the touch structure layer on each of the substrates comprises:
   forming a first transparent electrode layer on each of the substrates;
   patterning the first transparent electrode;
   forming an insulating layer on the patterned first transparent electrode layer;
   forming a second transparent electrode layer on the surfaces of the insulating layer and the carrier; and
   patterning the second transparent electrode layer.

3. The method of manufacturing the touch panel according to claim 2, wherein, the patterned first transparent electrode layer is made of Indium Tin oxide, Indium Zinc oxide, carbon nanotube, or Aluminum-Titanium codoped Zinc oxide.

4. The method of manufacturing the touch panel according to claim 2, wherein, the patterned second transparent electrode layer is made of Indium Tin oxide, Indium Zinc oxide, carbon nanotube, or Aluminum-Titanium codoped Zinc oxide.

5. The method of manufacturing the touch panel according to claim 2, wherein, the patterned first transparent electrode layer is located at a side of the top surface of the substrate.

6. The method of manufacturing the touch panel according to claim 2, wherein, forming and patterning the first transparent electrode layer comprises:
    depositing the first transparent electrode layer on the substrates and on the carrier; and
    etching the deposited first transparent electrode layer by a laser etching process.

7. The method of manufacturing the touch panel according to claim 6, wherein, during the laser etching process, the operating parameters of a laser device include: a working area of 1300 mm×1300 mm, an operating speed of 0-48000 mm/min, an operating AC voltage of 380V±10%, and an operating frequency of 50 HZ.

8. The method of manufacturing the touch panel according to claim 7, wherein the substrates are mechanically separated from the carrier.

9. The method of manufacturing the touch panel according to claim 6, wherein, a laser device used in the laser etching process has an etching precision of 3 μm~5 μm.

10. The method of manufacturing the touch panel according to claim 2, wherein, the insulating layer is located on the patterned first transparent electrode layer and exposes a part of the top of the patterned first transparent electrode layer.

11. The method of manufacturing the touch panel according to claim 10, wherein, the patterned second transparent electrode layer covers the insulating layer and exposes a part of the surface of each substrate.

12. The method of manufacturing the touch panel according to claim 2, wherein, forming and patterning the second transparent electrode comprises:
    depositing the second transparent electrode layer on the insulating layer and on the carrier; and
    etching the second transparent electrode layer by a laser etching process.

13. The method of manufacturing the touch panel according to claim 12, wherein, during the laser etching process, the operating parameters of a laser device include: a working area of 1300 mm×1300 mm, an operating speed of 0-48000 mm/min, an operating AC voltage of 380V±10%, and an operating frequency of 50 HZ.

14. The method of manufacturing the touch panel according to claim 12, wherein, a laser device used in the laser etching process has an etching precision of 3 μm~5 μm.

15. The method of manufacturing the touch panel according to claim 1, further comprising, adhering the substrates to the grooves with an adhesive.

16. The method of manufacturing the touch panel according to claim 15, further comprising heating the adhesive to separate the substrates from the carrier.

17. The method of manufacturing the touch panel according to claim 1, further comprising after placing the plurality of substrates into the grooves, and before forming the touch structure layers on the substrates, cleaning the carrier and the substrates.

18. The method of manufacturing the touch panel according to claim 1, wherein separating the substrates from the carrier comprises etching the touch structure layer between the substrates, and wherein the etching comprises a laser etching process, a dry etching process or a wet etching process.

19. The method of manufacturing the touch panel according to claim 1, wherein forming the touch structure layer comprises etching the touch layer structure substrates so as to separate the substrates from the carrier.

20. The method of manufacturing the touch panel according to claim 1, wherein the substrates comprise tempered glass or quartz.

* * * * *